United States Patent [19]

Hanazono et al.

[11] 4,003,772
[45] Jan. 18, 1977

[54] METHOD FOR PREPARING THIN FILM INTEGRATED CIRCUIT

[75] Inventors: Masanobu Hanazono; Osamu Asai, both of Hitachi, Japan

[73] Assignee: Hitachi, Ltd., Japan

[22] Filed: Feb. 18, 1975

[21] Appl. No.: 550,366

[30] Foreign Application Priority Data

Feb. 18, 1974 Japan .............................. 49-18587

[52] U.S. Cl. .......................... 156/656; 148/6.27; 156/661; 204/15; 204/23; 204/58; 427/91; 427/90
[51] Int. Cl.² ................................. H01L 21/441
[58] Field of Search ................ 156/3, 7, 8, 11, 13, 156/18; 204/23, 32 R, 58, 15, 32 S; 427/91, 90; 148/6.27

[56] References Cited
UNITED STATES PATENTS

| | | | |
|---|---|---|---|
| 3,723,258 | 3/1973 | Podell et al. | 204/58 |
| 3,756,924 | 9/1973 | Collins et al. | 204/58 |
| 3,759,798 | 9/1973 | Graff et al. | 204/58 |
| 3,825,453 | 7/1974 | Black et al. | 156/3 |
| 3,833,434 | 9/1974 | Kikuchi et al. | 156/17 |
| 3,855,112 | 12/1974 | Tomozawa et al. | 156/3 |

*Primary Examiner*—Edward G. Whitby
*Assistant Examiner*—Jerome W. Massie
*Attorney, Agent, or Firm*—Craig & Antonelli

[57] ABSTRACT

A thin film integrated circuit consists of a first conductor of aluminum extended in any desired direction on an insulating substrate, an anodized film formed by anodization in a chromic acid solution at positions other than cross-connectional parts on the first conductor, a second conductor cross-connected on the first conductor, and an anodized film formed by anodization in a chromic acid solution on the surface of the second conductor. The thin film integrated circuit is prepared by partially forming an anodized film in a sulfuric acid or oxalic acid solution at cross-connectional parts of a first conductor of aluminum so as not to form any anodized film in a chromic acid solution at the cross-sectional parts of the first conductor of the circuit, masking the partially formed anodized film with a photoresist film, then forming an anodized film by a chromic acid solution, and then removing the photoresist film and the anodized film. After the cross-sectional parts of the first conductor are exposed thereby, a second conductor is formed. For an etching solution for anodized film, which is anodized using the sulfuric acid or oxalic acid solution, a mixed solution consisting of 60 to 40 g/l of chromic acid and 40 to 300 g/l of oxidative acid is used.

10 Claims, 10 Drawing Figures

METHOD FOR PREPARING THIN FILM INTEGRATED CIRCUIT

BACKGROUND OF THE INVENTION

1. Field of the Invention

This invention relates to a structure of conductor to be used in a thin film integrated circuit and hybrid integrated circuit, and a method for preparing the same.

2. Description of the Prior Art

In integrated circuits, wirings are often cross-connected to other conductors on account of arrangements of parts. In the conventional thin film integrated circuits, cross-over parts of conductors are coated with an insulating material at first, and then the conductors are crossed, but an adhesive strength between the insulating material and the conductors is low. As a result, peeling of the insulating film or conductors film occurs.

To improve these drawbacks, there has been proposed a structure prepared by using an anodizable metal as a conductor and anodization at the surface of the metal, thereby forming an insulating film. There has been also proposed another structure of multi-layer conductor prepared by forming an anodizable metal on a substrate, then coating the metal with a photoresist in a desired conductor shape, anodizing the entire thickness of the metal, thereby obtaining flat surface circuits insulated with anodized film, then forming an insulating film of silicon oxide, etc., on the surface of the conductor, partially removing cross parts of the conductor by etching, forming again a second metal capable of forming an anodized film, and anodizing the second metal, thereby forming an anodized film throughout the entire thickness of the conductor and crossing the conductors. However, even in the latter conventional art, the adhesive strength is not so high, because there is a silicon oxide film between the conductors, and as a result, peeling is liable to take place. There have been also proposed methods for replacing the silicon oxide film with an anodized film in said structure or for anodization at the surface of the conductor, but it is not possible to form windows on the anodized film, because there is not available an appropriate etching solution for the anodized film, or even when partial etching is attempted, using a photoresist, it takes a long time in the etching of the anodized film, and the photoresist is deteriorated during the etching, losing the function as the photoresist. Furthermore, when it is tried to form anodized films partially, by using a chromic acid solution and masking by using a photoresist, chromic acid solution is permeated under the photoresist owing to the deterioration of the photoresist, and the anodized films are not formed in an exact shape. Furthermore, the anodized film formed by the chromic acid solution permeated under the photoresist is not readily etched for the same reason as above.

As a result of various studies on selective etching of the anodized film, particularly, that of aluminum, the present inventors have found that chemical resistances of anodized films depend upon kinds of anodization methods, and thus selective etching is possible to carry out. As a result, a conductor structure, whose cross-connectional parts are electrically connected, can be provided in the present invention.

SUMMARY OF THE INVENTION

An object of the present invention is to provide a wiring structure of integrated circuit, whose entire insulation is effected with anodized film.

Another object of the present invention is to provide a method for preparing a wiring structure of integrated circuit, whose cross-connectional parts are readily electrically connectable, by using two kinds of anodized film.

Other object of the present invention is to provide a method for preparing a wiring structure of integrated circuit by partially etching of the anodized film, using a photoresist, thereby forming some connection parts.

The present invention is characterized by a thin film integrated circuit conductor, which comprises an anodized film formed by anodization by using a chromic acid solution on the surface of a first film conductor of metal being capable of forming an anodized film, and being formed and extended in any desired direction on an isolating substrate except for substantial cross-connectional parts of the first film conductor, and a second film conductor being connected to said cross-connectional parts, and being extended in any desired direction.

DESCRIPTION OF THE PREFERRED EMBODIMENTS

As a conductor for thin film integrated circuits, aluminum is often used in addition to noble metals, copper, etc. Aluminum has such advantages as an easy vacuum deposition, better electric conductivity, formation of good insulating film by anodization at its surface, etc. As a result of various studies on properties of anodized films in carrying out multilayer wiring by a thin film technology, using the aluminum, the present inventors have found that there is a considerable difference in chemical properties between an anodized film formed by anodization in a chromic acid solution and an anodized film formed by anodization in a sulfuric acid solution or oxalic acid solution. The difference is that the anodized film of aluminum formed in the chromic acid solution is chemically more stable than the anodized film formed in a sulfuric acid solution or oxalic acid solution (which will be hereinafter referred to as "ordinary solution"). Consequently, the present inventors have found that it is possible to carry out selective etching by utilizing an appropriate etching solution.

When conductors are to be crossed with one another in a thin film circuit, an insulating film must be formed on the surface of lower layer conductor, but the formed insulating film is exposed to a treating atmosphere or treating solution directed to upper layer conductor, and thus an insulating film must be capable of withstanding such treatment.

The present invention is based on the finding that if cross-connectional parts of the lower layer conductor are masked with an anodized film formed in the ordinary solution, and if parts other than the cross-connectional parts are anodized in a chromic acid solution to form an anodized film, then the entire cross conductors of the thin film circuit can be insulated with the anodized film.

Since the conductor of such a thin film circuit has the anodized film formed in the ordinary solution at the cross-connectional parts, it is easy to etch the cross-connectional parts and connect them to another conductor. Furthermore, since the anodized film formed in the chromic acid solution is present at other parts than the cross-connectional parts, such masked parts are hardly attacked by the etching solution directed to the anodized film formed in the ordinary solution.

The anodized film formed in the chromic acid solution has less pinholes than the anodized film formed in the ordinary solution. This lead to a smaller leak current from the anodized film formed in the chromic acid solution than the anodized film formed in the ordinary solution, when they have an equal thickness. Furthermore, the adhesive strength between the anodized film formed in the chromic acid solution and the upper layer aluminum conductor is higher than that between other insulating film, for example, vacuum deposited film of silicon oxide, and the upper layer aluminum conductor. This is another advantage of the present invention.

The order of forming the anodized films is as follows: an anodized film is partially formed only at cross-connectional parts of conductor in the ordinary solution at first, and then the conductor is anodized in a chromic acid solution. That is, before the anodization in the ordinary solution, other parts than the cross-connectional parts are masked with a photoresist film, and then the conductor is anodized. Then, the cross-connectional parts are masked with a photoresist film, and the photoresist film at other parts than the cross-connectional parts is removed, and the other parts of the conductor core anodized in a chromic acid solution. When the cross-connectional parts are not masked with the photoresist film at the anodization in the chromic acid solution, the anodized film at the cross-connectional parts will be in a two-layer structure consisting of an anodized film layer formed in the ordinary solution and an anodized film layer formed in the chromic acid solution, and is as hardly etched as the anodized film formed in the chromic acid solution. When the anodization in the chromic acid solution is carried out after the cross-connectional parts have been masked with the photoresist film, on the other hand, the anodized film is not formed at the cross-connectional parts at all in the chromic acid solution, or is formed to such a degree as to assure the etching, even if the photoresist film is deteriorated in the chromic acid solution.

Sufficient thickness of the anodized film formed in the chromic acid solution is about 1 $\mu$ to about 5 $\mu$. In other words, the anodization time is about 5 to about 90 minutes at 35 V. Sufficient thickness of the anodized film formed in the ordinary solution is also about 1 $\mu$ to about 5 $\mu$. In other words, the anodization time is about 5 to about 60 minutes at 10 V in the case of the sulfuric acid solution.

Furthermore, in accordance with the present invention, it is possible to form the cross-connected conductors in a flat state with less difference in level on the upper surface of the circuit. That is, other parts than a pattern of aluminum conductor vacuum deposited on the entire surface of an isolating substrate are masked with a photoresist film, and anodized in the ordinary solution to obtain a thin anodized film. Then, the photoresist film is removed, and after masking is again formed in the same shape as the anodized film with a photoresist film, anodization is carried out to the entire thickness of the metal in a chromic acid solution. Then, the photoresist film is removed, and again masking is formed with a photoresist film only to expose cross-connectional parts. The anodized film formed in the ordinary solution at the cross-connectional parts is etched. When the aluminum at the cross-connectional parts is exposed, the deposited photoresist film is removed. Then, aluminum is vacuum deposited on the surface, and again masking is formed in a pattern contrary to the shape of the first conductor with a photoresist film. Then, anodization is carried out to the entire thickness in a chromic acid solution.

The selective etching solution for etching only the anodized film formed by anodization in the ordinary solution consists of chromic acid and an oxidative acid, as described above. Selectivity of the etching solution to the anodized film formed in the chromic acid solution or that formed in the ordinary solution is improved by adjusting the etching solution to a definite concentration range. Aluminum will be no more etched consequently.

The higher the chromic acid concentration, the lower the etching speed of the anodized film formed in the chromic acid solution.

The higher the oxidative acid concentration, the higher the etching speed of the anodized film formed in the ordinary solution. The higher chromic acid concentration will also improve the etching speed of the anodized film formed in the ordinary solution to some degree. However, when these two concentrations exceed some definite values, the etching speed will be lowered. The appropriate range of the etching speed is determined by the resistivity of the photoresist. Photoresist is liable to be deteriorated by an acid capable of decomposing the photoresist by oxidation, such as chromic acid, and cannot be dipped for over 5 minutes in a solution of 100 g of water and 100 g of chromic acid, even when 30 g of phosphoric acid is added thereto. That is, the etching speed of the anodized film formed in the ordinary solution is 0.3 $\mu$/min. in said amounts of etchant components, and thus it takes 6 minutes in etching of the anodized film having a thickness of 2 $\mu$.

When the amount of chromic acid is 60 g/l or more, the etching can be carried out at an etching speed of 1 $\mu$/3 minutes or higher, while maintaining the etching selectivity to the anodized film formed in the chromic acid solution or the anodized film formed in the ordinary solution, if the oxidative acid is at a concentration of 50 g/l or higher. Therefore, the photoresist film will not be deteriorated yet when the anodized film has a thickness of about 1.5 $\mu$. Maximum concentration that will not deteriorate the photoresist film by dipping for 5 minutes is 140 g/l for the chromic acid and 300 g/l for the oxidative acid. When the concentrations of chromic acid and oxidative acid each exceed said maximum values, the etching speed will be lowered, and when the photoresist film is exposed to the etching solution, the photoresist film will be deteriorated, and the conductor under the photoresist pattern will be anodized.

Furthermore, it is evident that temperature at the etching process has some influence upon the etching time. When the anodized film having a thickness of 1 $\mu$ formed in the ordinary solution is etched within 3 minutes, the preferable temperature is 35° to 70° C. When the anodized film having a thickness of 1 $\mu$ is etched within 1 minute, the preferable temperature is 45° to 70° C. If the etching temperature exceeds 70° C, the exactness of the etched shape will be degraded.

According to the present invention, a circuit conductor, all of whose parts other than the cross-connectional parts are insulated by the anodized film formed in the chromic acid solution, can be obtained, and the resulting circuit conductor is suitable for the thin film integrated circuit having less leak current. Even when the conductors are cross-connected, a hardly peelable integrated circuit piece can be obtained on account of the higher adhesive strength between the upper layer conductor and the anodized film.

According to the present invention two kinds of the insulating films, that is, the anodized film formed in the chromic acid solution and the anodized film formed in the ordinary solution, can be used. These anodized films can be selectively used. For example, the anodized film is formed in the chromic acid solution where the characteristics of the anodized film formed in the chromic acid solution is required, and the anodized film is formed in the ordinary solution at other parts than the above. Since the highly chemical-resistant anodized film is formed in the chromic acid solution at other parts than the cross-connectional parts of conductor, the upper layer aluminum conductor can be etched without attacking the lower layer aluminum conductor.

Now, the present invention will be explained by way of the accompanying drawings.

Figure 1:
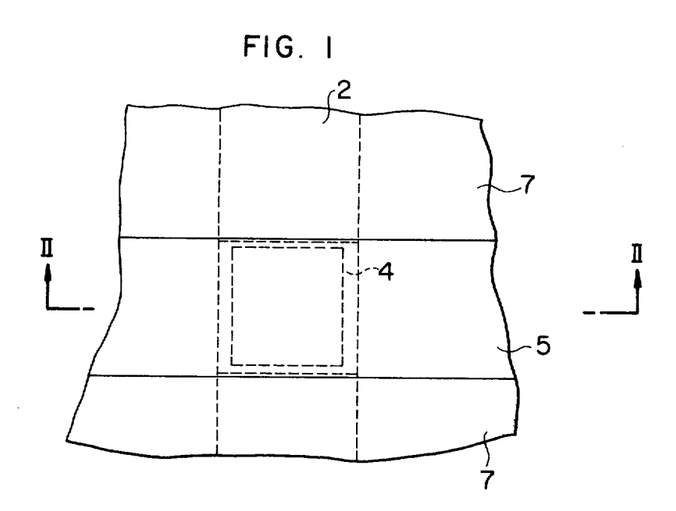
FIG. 1 is a plan view of thin film integrated circuit conductor of the present invention.
Figure 2:
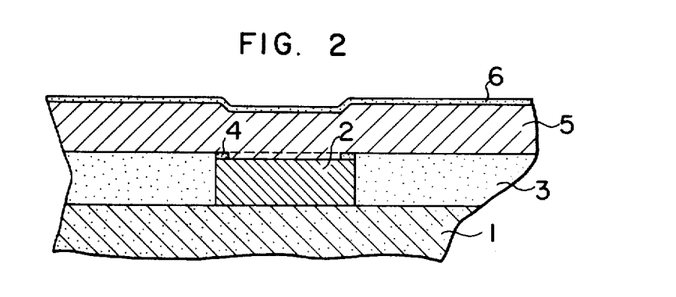
FIG. 2 is a cross-sectional view along the line II — II of FIG. 1.

FIG. 1 is a plan view of a structure of thin film conductor circuit representing one embodiment of the present invention, and FIG. 2 is a vertical cross-sectional view along line II – II of FIG. 1.

Aluminum conductor 2 having a width of 150 $\mu$ and thickness of 10 $\mu$ is deposited on electrically insulated plate 1 and anodized films 3 having a thickness of 10 $\mu$ are formed in a chromic acid solution in the area adjacent to the aluminum conductor so as to form a flat surface at the same level as that of the aluminum conductor on the electrically insulating substrate plate by anodizing the entire aluminum layer in that area. Anodized film 4, 1 $\mu$ in thickness, having a window is formed in a sulfuric acid solution on the surface of conductor 2. There are anodized films having a thickness of 1 $\mu$ formed in the chromic acid solution in the area outside anodized film 4 on conductor 2. There is an aluminum conductor 5 having a thickness of 10 $\mu$ on anodized films 3 and conductor 2, anodized films 7 having a thickness of 10 $\mu$ formed in the chromic acid solution in the area adjacent to conductor 5, and anodized film 6 having a thickness of 1 $\mu$ on conductor 5. In this manner, the entire surface of cross-connected conductors can be insulated by anodized films, using both anodized film formed in the chromic acid solution and anodized film formed in the ordinary solution in the present invention. The anodized films rigidly and tightly adhere to the surface of aluminum conductor, and thus are hardly peeled off. The anodized films also have a better insulating property, and thus are suitable as an insulating coating.

Said cross-connectional parts are formed in the following manner. After aluminum is vapor deposited onto substrate plate 1, a photoresist film is formed on the surface of aluminum in such a pattern as to expose the cross-connected parts, and anodized films 4 are formed on the entire surfaces of the cross-connectional parts in the ordinary solution. Then, a photoresist film is formed in such a shape as to expose a shape of the conductor. The surfaces of the conductor are anodized in the chromic acid solution to form an anodized film having a thickness of 1 $\mu$ on the conductor. Then, the photoresist film is again formed by remasking in the shape of the conductor, and the exposed aluminum is entirely anodized in the chromic acid solution to form anodized films 3. Further, the photoresist film is formed by remasking in such a shape as to expose portions of the cross-connectional parts, and the exposed portions of the cross-connectional parts are etched by an etching solution consisting of 100 g/l of chromic acid and 200 g/l of phosphoric acid at 50° C to form anodized films 4 each having a window. Then, aluminum is formed to a thickness of 10 $\mu$ on the surface, and anodized film 6 is formed to a thickness of 1 $\mu$ in the chromic acid solution. Then, a photoresist film is formed by masking in a shape of conductors crossing at the windows of anodized films 4, and the entire thickness of the aluminum is anodized to form anodized films 7.

That is to say, the anodized films at the cross-connectional parts are used together with the photoresist films as an anodizing masking film for the anodized film to be formed in the chromic acid solution in the foregoing structure, and further a thin anodized film is formed with the chromic acid solution on the surfaces of the conductors in the area outside of the cross-connectional parts, and is used together with the photoresist as an anodizing masking material for the anodized film to be formed to the entire thickness of the aluminum. In the foregoing structure, the crossed upper layer conductors are formed in a flat state, and thus have no indented parts, and no risk of breaking wires.

Figure 3:
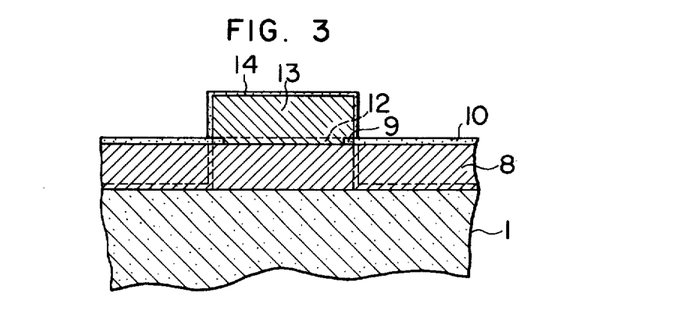
FIG. 3 is a vertical cross-sectional view of thin film integrated circuit conductor representing another embodiment of the present invention.
Figure 4A:
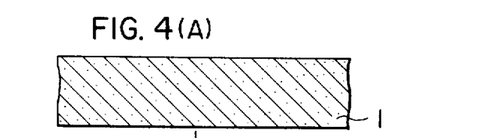
FIG. 4 is vertical cross-sectional views showing individual steps of a method for preparing the thin film integrated circuit conductor of FIG. 3.
Figure 4B:
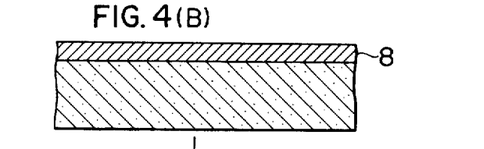
Figure 4C:
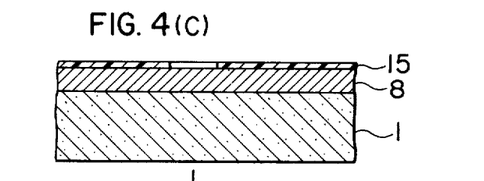
Figure 4D:
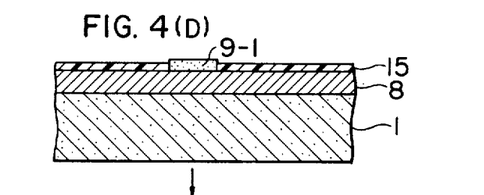
Figure 4E:
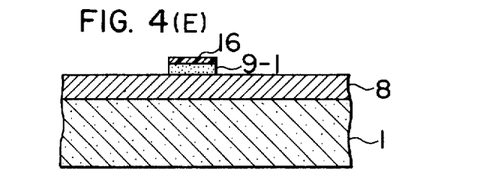
Figure 4F:
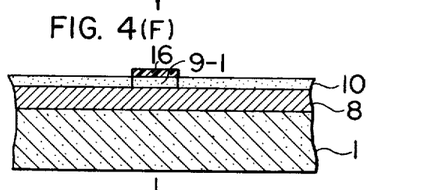
Figure 4G:
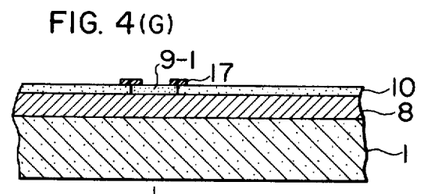
Figure 4H:
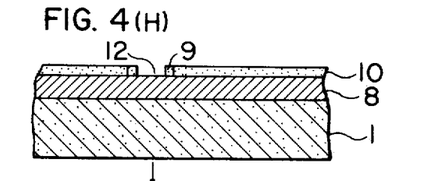
Figure 4I:
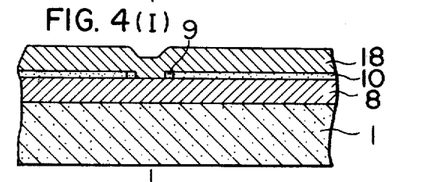
Figure 4J:
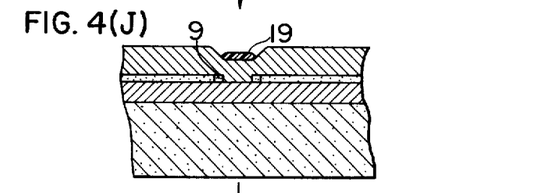
Figure 4K:
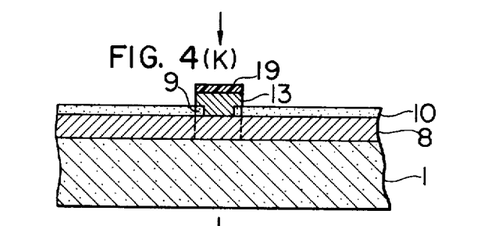
Figure 4L:
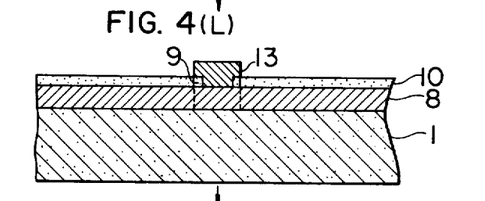
Figure 4M:
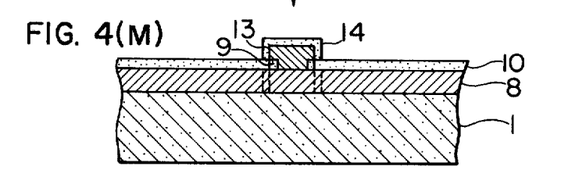

FIG. 3 is a vertical cross-sectional view of conductor-connectional part of thin film circuit representing another embodiment of the present invention. Conductor 8 of aluminum having a thickness of 10 $\mu$ and any desired width is formed on a substrate plate 1, and anodized films 9 by using the ordinary solution and anodized films 10 by using the chromic acid solution are formed on the conductor. Further, conductor 13 of aluminum having a thickness of 10 $\mu$ and any desired width is formed in contact with windows 12 of anodized film 9. Furthermore, there is an anodized film 14 formed in the chromic acid solution on the surface of conductor 13.

FIG. 4 is vertical cross-sectional views showing individual steps in preparing the structure of circuit conductor connection shown in FIG. 3. On an insulating substrate plate of step (A), for example, alumina substrate plate, is formed a conductor 8 having a thickness of 10 $\mu$ and any desired width, as shown in step (B), and then photoresist 15 is formed thereon so as to expose parts of conductor 8, as shown in step (C). Then, anodized film 9-1 is formed on the exposed parts in the ordinary solution, as shown in step (D). Then, photoresist film 15 is removed, and photoresist film 16 is formed on anodized film 9-1, as shown in step (E). Then, anodization film 10 is formed in the chromic acid solution, as shown in step (F). Photoresist film 16 is partially removed, or photoresist film 17 is newly formed so as to expose the center part of anodized film 9-1, as shown in step (G), and then etching process is carried out at 50° C with an etching solution consisting of 150 g/l of chromic acid and 200 g/l of phosphoric acid to expose conductor 8 and form anodized film 9 having a window 12, as shown in step (H). Then, aluminum 18 is formed to a thickness of 10 $\mu$, as shown in step (I), and then photoresist 19 is formed in a pattern of crossing conductor at the position of window 12, as shown in step (J). Then, etching is carried out, as shown in step (K). The etching solution is an aqueous solution of alkali hydroxide or acid. Then, photoresist 19 is removed, as shown in step (L), and further anodized film 14 is formed in the chromic acid solution, as shown in step (M).

In the embodiment of FIGS. 3 and 4, anodized film 9-1 is used together with photoresist film 16 as an anodizing masking material for the formation of anodized film 10 by using the chromic acid solution, as in FIGS. 1 and 2, whereby the anodized film formed in the chromic acid solution can be provided in the area outside the cross-connectional parts. The anodized film formed in the chromic acid solution present in the area outside of the cross-connectional parts of conductor 8, cannot be readily removed, even if the anodized film is in contact with other treating solution. Furthermore, the films formed on the exposed parts have a good insulating properties, and thus current leakage can be lessened.

Figure 5:
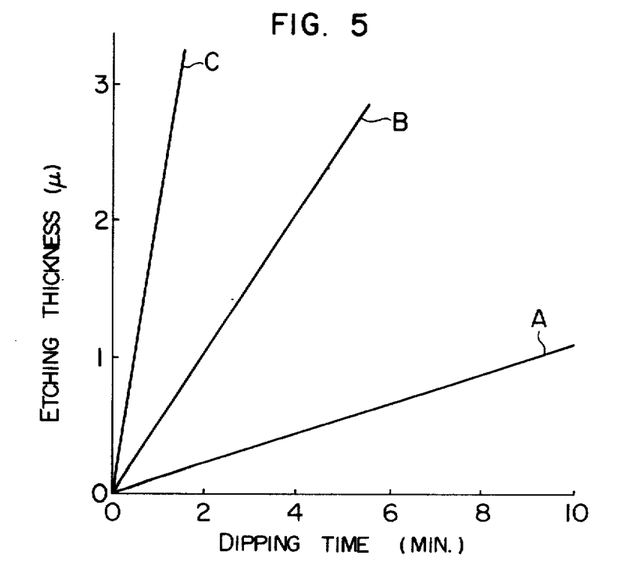
FIG. 5 is a graph showing relations between a dipping time of etching solution used for the preparation of the thin film integrated circuit of the present invention and an etching depth by way of concentration as parameter.

FIG. 5 is a graph showing relations between the dipping time of etching solution which is applicable to the etching process for the anodized film formed in the ordinary solution, and the etching depth, where the relations between the dipping time and the etching depth are shown when the etching of anodized film having a thickness of 1 $\mu$ formed in sulfuric acid solution (15% by weight, 25° C) is carried out at 55° C with etching solutions having the following compositions.

| Composition | Phosphoric acid | Chromic acid | Water |
| --- | --- | --- | --- |
| A | 35 g | 20 g | 1000 g |
| B | 100 g | 60 g | 1000 g |
| C | 200 g | 100 g | 1000 g |

Symbols A, B and C in FIG. 5 correspond to those of the compositions given in the foregoing table. It is seen from FIG. 5 that the anodized film can be etched at higher etching speed when the concentrations of phosphoric acid and chromic acid are higher.

Figure 6:
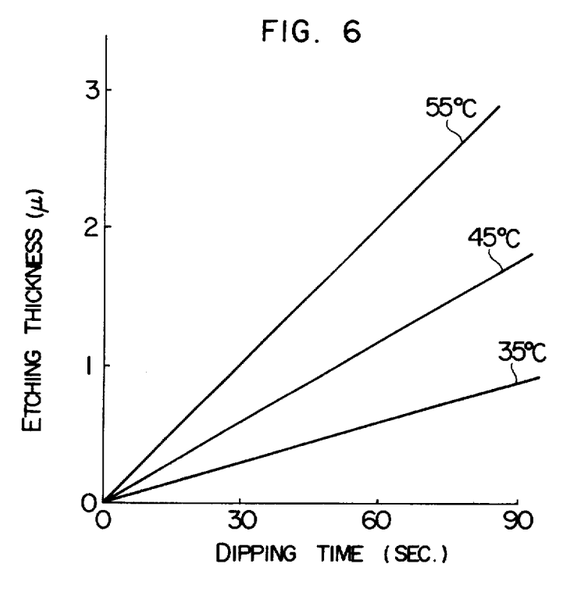
FIG. 6 is a graph showing relations between a dipping time and an etching depth by way of temperature as parameter.

Dependency of the etching speed upon temperature as to composition C of FIG. 5 is shown in FIG. 6, where the anodized films of aluminum are the same as in FIG. 5. It is seen from FIG. 6 that etching can be carried out at an etching speed of higher than about 1 $\mu$/min. at a temperature of 45° C or higher, when the etching solution having said composition C is used.

In the photoetching process, photoresist is deteroriated if the temperature of etching solution is higher, and consequently an exact shape cannot be obtained. It has been found from the results of preliminary study, using said composition C of FIG. 5 that reproducibility of the etching pattern is poor at a higher temperature than 70° C. From said results, as well as the results shown in FIG. 6, it has been found that a suitable temperature for etching with the etching solution having said composition C of FIG. 5 is in a range of 45° to 70° C.

Figure 7:
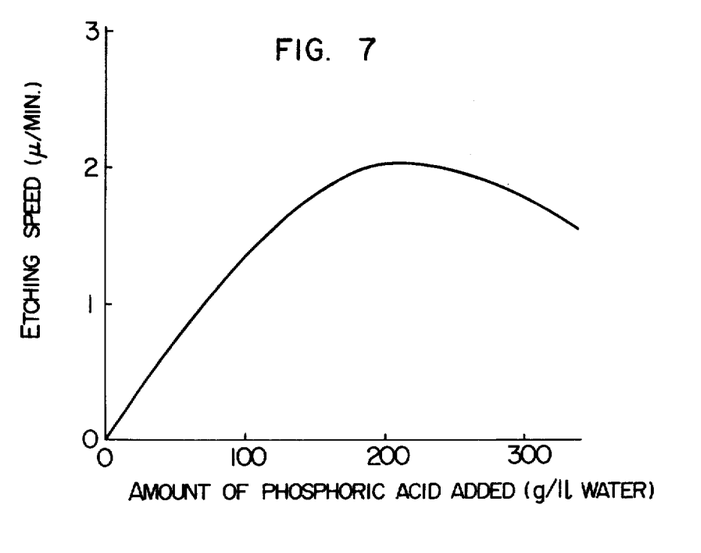
FIG. 7 is a graph showing relations between an amount of phosphoric acid added and an etching speed.

FIG. 7 shows results of determining etching speed ($\mu$/min.) when the concentration of phosphoric acid is increased, while maintaining the concentration of chromic acid at 100 g/l, where the same anodized films of aluminum as in FIG. 5 are used at an etching temperature of 55° C. It is seen from FIG. 7 that when about 100 g or more/l of phosphoric acid is contained, an etching speed of more than about 1 $\mu$/min. can be obtained, whereas the etching speed is decreased when more than 200 g/l of phosphoric acid is contained.

Figure 8:
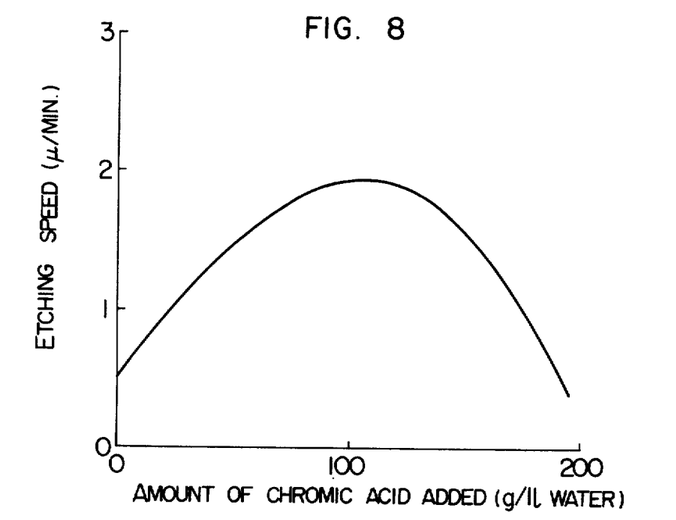
FIG. 8 is a graph showing relations between an amount of chromic acid added and an etching speed.

FIG. 8 shows results of determining etching speeds ($\mu$/min.) when the concentration of chromic acid is changed, while maintaining the concentration of phosphoric acid at 200 g/l, where the same anodized films of aluminum as in FIG. 5 are used at an etching temperature of 55° C. It is seen from FIG. 8 that the preferable concentration of chromic acid is about 100 g/l.

It is seen from FIGS. 7 and 8 that a good result can be obtained, when etching is carried out at the concentration of chromic acid of 60 to 140 g/l and the concentration of phosphoric acid of 120 to 300 g/l.

Figure 9:
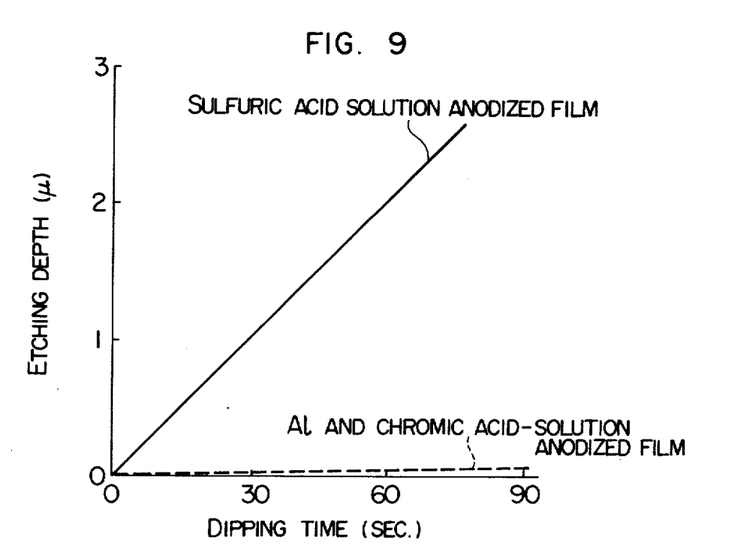
FIG. 9 is a graph showing relations between a dipping time and an etching depth for individual films.

Furthermore, it has been investigated how or in what degree aluminum is etched, when one side of aluminum is anodized in the same sulfuric acid solution as in FIG. 5 in the same manner as in FIG. 5 to form an anodized film in the sulfuric acid solution, and other side of aluminum in a 5% chromic acid solution at 35° C, and the resulting aluminum having the anodized films at both sides is subjected to etching with the etching solution having the same composition C as in FIG. 5. The results are shown in FIG. 9. From FIG. 9 it is evident that aluminum is hardly etched. It is seen from the foregoing results that by using the aforesaid etching solution, we can selectively etch the anodized film, which is anodized in the sulfuric acid solution without etching aluminum. Furthermore, it is seen from FIG. 9 that the anodized film of aluminum formed in the chromic acid solution (5% chromic acid, 35° C) is not etched by the etching solution having said composition C.

Figure 10:
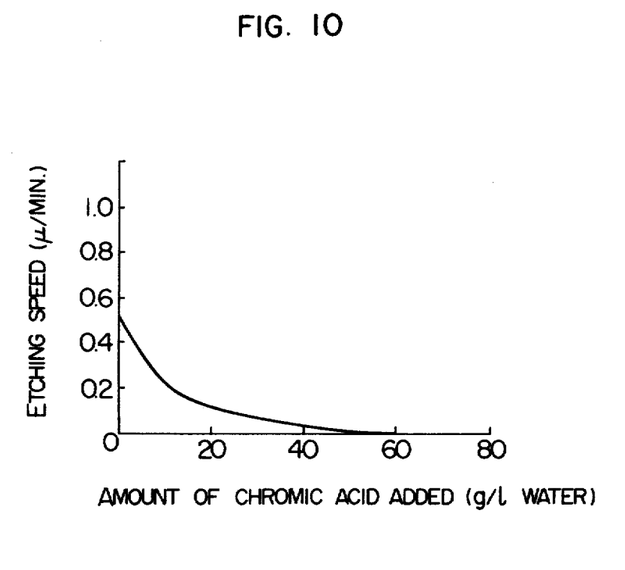
FIG. 10 is a graph showing relations between an amount of chromic acid added to the etching solution for aluminum-anodized film by using chromic acid solution and an etching speed.

FIG. 10 shows relations between the etching speed of aluminum formed in a 5% chromic acid solution at 35° C and varied amount of chromic acid added to an etching solution, when the anodized film is dipped in the etching solution containing 200 g/l of phosphoric acid and varied amount of chromic acid and etched at 55° C. It is seen from FIG. 10 that the etching speed of anodized film of aluminum formed in the chromic acid solution is decreased with the increasing amount of chromic acid, and the anodized film formed in the chromic acid solution is no more dissolved, if the amount of chromic acid exceeds 50 g/l in the etching solution.

In the case of the ordinary photoresist, on the other hand, a deterioration phenomenon appears 5 minutes after dipping in a phosphoric acid etching solution. Therefore, it is quite safe to complete the etching within about 2.5 minutes, when an oxidative acid such as chromic acid is added to the phospheric acid etching solution. Furthermore, it is preferable to effect etching within a shorter time to improve the exactness of etched shape. Therefore, the preferable etching speed is about 1 $\mu$/min. in view of the foregoing facts. Usually, the thickness of the ordinary anodized film of aluminum is less than 3 - 5 $\mu$, but it is desirable to complete the etching even at that thickness within such a time that the photoresist is not peeled off. Thus, in view of the results shown in FIGS. 5 to 10, the preferable composition of aqueous etching solution for the anodized film of aluminum is given as follows:

Chromic acid: 60 – 140 g/l
Phosphoric acid: 80 – 300 g/l

The preferable etching temperature is 35° to 70° C. In the foregoing illustrations, the etching solution based on a mixture of chromic acid and phosphoric acid is used, but the mixtures of chromic acid and perchloric acid or nitric acid can also be used for selective etching of the anodized film of aluminum formed in a sulfuric acid solution.

Perchloric acid: 50 – 300 g/l
Nitric acid: 40 – 300 g/l

As described above, the present invention provides a structure of cross-connected conductors for integrated circuit, all being insulated by anodized films. Furthermore, the present invention provides a method for selective anodization, using anodizing masking material consisting of double film of an anodized film formed in the ordinary solution and a photoresist. Still furthermore, the present invention provides a method for preparing a cross-connectional structure of integrated circuit conductors, all the surfaces of which are insulated by anodized films, using an etching solution capable of selectively etching two kinds of anodized films, that is, the film formed in the ordinary solution and the film in the chromic acid solution. Still furthermore, the present invention provides a method for adjusting levels of lower layer conductor and upper layer conductor by controlling the thickness of the anodized film by etching, and controlling dipping time of anodized film, and furthermore a method for wiring the upper conductor in a flat surface.

According to the present invention, a structure of cross-connected conductor for integrated circuit, having hardly peelable insulating films owing to rigid and tight adhesion between the conductors and the insulating films can be obtained.

Furthermore, anodized film formed in a chromic acid solution having a good electrical insulation and high reliability can be disposed at the exposed parts of conductors by anodizing the conductor, without using any other insulating material, to form an insulating film, and further by selectively using two kinds of anodization methods for that purpose in the present invention.

What is claimed is:

1. A process for preparing a thin film integrated circuit comprising a substrate, a first aluminum conductor pattern on said substrate and a second aluminum conductor pattern on said first aluminum conductor pattern, said first and second aluminum conductor patterns being different from one another and defining cross-connectional areas where said first and second aluminum conductor patterns are in contact with one another, said process comprising:
    forming said first aluminum conductor pattern on said substrate;
    depositing on those portions of said first aluminum conductor pattern defining said cross-connectional areas an anodizing mask comprising an anodized film formed in an ordinary solution and a photoresist film on said anodized film;
    depositing on the portions of said first aluminum conductor pattern not covered with said mask an anodized film formed in a chromic acid solution;
    removing said anodizing mask by treating said anodizing mask with a chromic acid soluton; and
    forming said second aluminum conductor pattern on said first aluminum conductor pattern.

2. A method according to claim 1, wherein the anodized film of said anodizing mask is removed by etching using an etching solution containing 60 to 140 g/l of chromic acid and 40 to 300 g/l of oxidative acid.

3. A method for preparing a thin integrated circuit, which comprises forming a first aluminum conductor having a predetermined pattern on an insulating substrate plate, forming a first photoresist film on said first aluminum conductor in areas other than areas of said first aluminum conductor defining cross-connectional portions to be in contact with a second aluminum conductor, forming a first anodized film in an ordinary solution on exposed areas of said first aluminum conductor, forming a second photoresist film on said first anodized film while removing said first photoresist film, forming a second anodized film in a chromic acid solution on the exposed parts of said first conductor of aluminum, removing said second photoresist film, removing said first anodized film by etching thereby exposing said first conductor of aluminum, and forming a second aluminum conductor on said second anodized film, said second aluminum conductor crossing and coming into contact with exposed areas of said first aluminum conductor.

4. A method according to claim 3, wherein said first anodized film is removed by etching using an etching solution containing 60 to 140 g/l of chromic acid and 40 to 300 g/l of an oxidative acid.

5. A method for forming a thin film integrated circuit comprising a substrate, a first conductor layer on said substrate and a second conductor layer on said first conductor layer, each of said first and second conductor layers comprising an aluminum conductor pattern and adjacent insulation of equal thickness, the conductor pattern in said first conductor layer contacting the conductor pattern in said second conductor layer in at least one cross-connectional area, said process comprising:
    forming a first aluminum film on said substrate;
    forming on the portions of said first aluminum film defining said at least one cross-connectional area a first anodizing mask comprising an anodized film formed in an ordinary solution and a photoresist film on said anodized film;
    forming on the portions of said first aluminum film not covered by said first anodizing mask an anodized film by means of a chromic acid solution;

forming on said anodized film a first photoresist layer having a shape corresponding to the shape of the aluminum conductor pattern to be produced in said first conductor layer;

anodizing by means of a chromic acid solution said first aluminum film except for the portion of said first aluminum film defining the aluminum conductor pattern of said first conductor layer to the entire thickness of said first aluminum layer to produce the aluminum conductor pattern and insulation of said first conductor layer;

removing said first photoresist layer;

removing said anodizing mask by etching; and forming said second conductor layer.

6. The process of claim 5, wherein said second conductor layer is formed by:

forming a second aluminum film overlying the entire surface of said first conductor layer;

forming on said second aluminum film a second anodizing mask defining an aluminum conductor pattern comprising an anodized film formed in an ordinary solution and a photoresist layer on said anodizing film; and anodizing by means of a chromic acid solution said second aluminum film except for the portions of said second aluminum film defining the aluminum conductor pattern of said second conductor layer to the entire thickness of said second aluminum layer.

7. A method according to claim 5, wherein the anodized film formed in the ordinary solution on the cross-connectional parts is removed by etching, using an etching solution containing 60 to 140 g/l of chromic acid and 40 to 300 g/l of an oxidative acid.

8. A method for forming a thin film integrated circuit comprising a substrate, a first conductor layer on said substrate and a second conductor layer on said first conductor layer, each of said first and second conductor layers comprising an aluminum conductor pattern and adjacent insulation of equal thickness, the conductor pattern in said first conductor layer contacting the conductor pattern in said second conductor layer in at least one cross-connectional area, said method comprising:

forming a first aluminum film on said substrate;

forming on said first aluminum film a first anodizing mask comprising an anodized film formed in an ordinary solution and a photoresist film on said anodized film, said first anodizing mask having a shape corresponding to the shape of the aluminum conductor pattern to be produced in said first conductor layer;

anodizing by means of a chromic acid solution said first aluminum film except for the portion of said first aluminum film defining the aluminum conductor pattern of said first conductor layer to the entire thickness of said first aluminum layer to produce the aluminum conductor pattern and insulation of said first conductor layer;

removing said anodizing mask from those portions of said first conductor layer defining said at least one cross-connectional area by etching; and forming said second conductor layer.

9. The method of claim 8, wherein said second conductor layer is formed by:

forming a second aluminum film overlying the entire surface of said first conductor layer;

forming on said second aluminum film a second anodizing mask comprising an anodized film formed in an ordinary solution and a photoresist layer on said anodizing film; and anodizing by means of a chromic acid solution said second aluminum film except for the portions of said second aluminum film defining the aluminum conductor pattern of said second conductor layer to the entire thickness of said second aluminum film.

10. A method according to claim 8, wherein the anodized film formed in the ordinary solution on the cross-connectional parts is removed by etching using an etching solution containing 60 to 140 g/l of chromic acid and 40 to 300 g/l of an oxidative acid.

* * * * *